US009667897B2

(12) United States Patent
Margaux et al.

(10) Patent No.: US 9,667,897 B2
(45) Date of Patent: May 30, 2017

(54) METHOD AND CIRCUIT FOR READING AN ARRAY OF OSCILLATORS

(71) Applicant: Commissariat à l'Energie Atomique et aux Energies Alternatives, Paris (FR)

(72) Inventors: Vigier Margaux, Grenoble (FR); Bertrand Dupont, Gargas (FR); Arnaud Peizerat, Grenoble (FR); Jean-Pierre Rostaing, La Côte Saint-Andre (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 15/061,586

(22) Filed: Mar. 4, 2016

(65) Prior Publication Data

US 2016/0261816 A1    Sep. 8, 2016

(30) Foreign Application Priority Data

Mar. 5, 2015    (FR) ..................................... 15/51865

(51) Int. Cl.
*H04N 5/33*    (2006.01)
*H04N 5/376*    (2011.01)
(Continued)

(52) U.S. Cl.
CPC ........... *H04N 5/3765* (2013.01); *G01R 23/10* (2013.01); *H04N 5/33* (2013.01); *H04N 5/363* (2013.01); *H04N 5/378* (2013.01)

(58) Field of Classification Search
CPC ........ H04N 5/3765; H04N 5/33; H04N 5/363; H04N 5/378; H04N 5/376; G01R 23/10
(Continued)

(56) References Cited

U.S. PATENT DOCUMENTS

| 5,900,856 A * | 5/1999 | Iino .................... G09G 3/3611 345/100 |
| 2011/0150031 A1 | 6/2011 | Abdelmoneum et al. |

(Continued)

OTHER PUBLICATIONS

"An Area—Efficient PLL Architecture in 90-nm CMOS"; Peter J. Lim, 2005 Symposium on VLSI Circuits Digest of Technical Papers; 2 pgs.

(Continued)

*Primary Examiner* — Sherrie Hsia
(74) *Attorney, Agent, or Firm* — Moreno IP Law LLC

(57) ABSTRACT

A detection device comprises an array of pixels, each pixel including a sensor and generating an oscillating signal (S); and a frequency detection circuit (206, 208, 210) for detecting the frequency of the oscillating output signal of one or more of the pixels, the frequency detection circuit having: a window generation circuit (208) adapted to generate at least one output signal (WIN_SEN) indicating the start and end times of a first time duration (TWINDOW) corresponding to a plurality of periods of the oscillating output signal; and one or more counters (210) adapted to receive at least one reference signal (TCOUNT, TREAD) indicating the start and end times of a reference time duration (TREF), and to quantify a difference between the first time duration and the reference time duration.

12 Claims, 4 Drawing Sheets

(51) Int. Cl.
  *H04N 5/378* (2011.01)
  *G01R 23/10* (2006.01)
  *H04N 5/363* (2011.01)

(58) Field of Classification Search
  USPC ............... 348/164, 500, 536, 537, 725, 726,
              348/731–733, 735, 707; 330/10, 272,
              330/305; 331/1 R, 16, 25, 34
  IPC ............... H04N 5/33, 5/376, 5/378, 5/04, 5/50,
              H04N 5/44, 5/14
  See application file for complete search history.

(56) References Cited

U.S. PATENT DOCUMENTS

2013/0018616 A1  1/2013  Chou et al.
2015/0300999 A1  10/2015  Andreucci et al.

OTHER PUBLICATIONS

International Search Report filed in FR 15/51865, dated Jan. 26, 2016, 2 pgs.

\* cited by examiner

METHOD AND CIRCUIT FOR READING AN ARRAY OF OSCILLATORS

FIELD

The present disclosure relates to the field of detection devices based on oscillators, and in particular to a method and circuit for reading an array of oscillators.

BACKGROUND

A MEMS (micro-electro-mechanical system) oscillator has been proposed that is capable of operating as a detection device, the oscillation frequency of the oscillator being dependent on one or more environmental conditions. An array of such MEMS oscillators can be used to generate an image of a scene, and the data from the array is read by detecting the frequency of an output signal of each oscillator in the array.

One solution for detecting the frequency of the output signal of a MEMS oscillator would be to count in each pixel a given number of periods of the output signal, and to accurately measure within each pixel the time duration of those periods using a further counter. However, to provide an accurate measure of the oscillation frequency, the number of periods should be relatively high and the further counter should operate at many times the frequency of the oscillating signal, meaning that a relatively large counter is required in each pixel, leading to a high chip area.

A further difficulty in an array of MEMS oscillators is compensating for temperature variations and dispersion between pixels, which can add noise to the output data of the array.

There is a need in the art for a circuit and method for reading an array of oscillators providing an improvement over existing solutions in terms of chip area, power consumption and/or image quality.

SUMMARY

It is an aim of embodiments of the present invention to at least partially address one or more needs in the prior art.

According to one aspect, there is provided a detection device comprising: an array of pixels, each pixel comprising a sensor and generating an oscillating signal; and a frequency detection circuit for detecting the frequency of the oscillating output signal of one or more of the pixels, the frequency detection circuit comprising: a window generation circuit adapted to generate at least one output signal indicating the start and end times of a first time duration corresponding to a plurality of periods of the oscillating output signal; and one or more counters adapted to receive at least one reference signal indicating the start and end times of a reference time duration, and to quantify a difference between the first time duration and the reference time duration.

According to one embodiment, each of the start and end times of the first time duration and the reference time duration are indicated by a signal edge.

According to one embodiment, the one or more counters are adapted to quantify a first difference between the start of the first time duration and the start of the reference time duration and a second difference between the end of the first time duration and the end of the reference time duration.

According to one embodiment, the one or more counters are adapted: to quantify the first difference by incrementing or decrementing a count value based on the respective timing of the start of the first time duration and the start of the reference time duration; and to quantify the second difference by incrementing or decrementing a count value based on the respective timing of the end of the first time duration and the end of the reference time duration.

According to one embodiment, each pixel is adapted to receive a timing signal indicating the start time of the reference time duration, the start time of the first time duration being triggered by the first edge of said oscillating signal after the timing signal is asserted.

According to one embodiment, the detection device further comprises a control circuit adapted to generate the timing signal based on a reference pixel blinded from the image scene.

According to one embodiment, each pixel comprises a first counter adapted to output a first count value representing a time interval between the start times of the reference time duration and the first time duration; and the pixel array further comprises one or more second counters adapted to receive the output signal from at least one of the pixels and to generate a second count value representing a time interval between the end times of the reference time duration and first time duration.

According to one embodiment, each pixel further comprises a delay circuit adapted to shift the timing of the timing signal to adjust the start time of said reference time duration.

According to one embodiment, the delay circuit comprises a memory storing one or more bits of data indicating the adjustment to be made to the start time of said reference time duration.

According to one embodiment, the detection device further comprises a processing circuit adapted to process the quantified differences between the first time duration and the reference time duration for a plurality of said pixels, and to adjust the start time of said timing signal for said plurality of pixels based on said quantified differences.

According to one embodiment, the processing circuit is adapted to adjust the start time of said timing signal such that a certain proportion of said quantified differences fall with a certain range.

According to a further aspect, there is provided a detection device comprising: an array of pixels comprising at least one column of pixels and a plurality of rows, each pixel comprising a sensor and generating an oscillating signal; and a frequency detection circuit for detecting the frequency of the oscillating output signal of each pixel, comprising: in each pixel, a window generation circuit adapted to generate at least one output signal indicating the start and end times of a first time duration corresponding to a plurality of periods of the oscillating output signal of the pixel, wherein each row of pixels is adapted to receive a timing signal indicating the start time of a reference time duration for the pixels of the row, the start time of the first time duration being triggered by the first edge of said oscillating signal after the timing signal is asserted; and counters adapted to receive at least one reference signal indicating the start and end times of the reference time duration, and to quantify, for each pixel, a difference between the first time duration and the reference time duration, wherein the counters are adapted to quantify a first difference between the start of the first time duration and the start of the reference time duration and a second difference between the end of the first time duration and the end of the reference time duration; the counters comprise, for each column, a common counter coupled to all of the pixels of the column through selection means and adapted to quantify, successively for each pixel of the column, the second difference for the selected pixel, each row of pixels being selected during a different selection period; and the timing signal indicating the start time of the reference time duration for the pixels of a row is different for each row and defined such that the end of the first time duration of each pixel of a row appears during the selection period of the row to enable the quantification of the second difference by each common counter.

According to a further aspect, there is provided a method of reading an array of pixels, each pixel comprising a sensor and generating an oscillating output signal, the method comprising detecting the frequency of the oscillating output signal of one or more of the pixels by: generating a first signal indicating the start and end times of a first time duration corresponding to a plurality of periods of the oscillating output signal; receiving by one or more counters, at least one reference signal indicating the start and end times of a reference time duration; and quantifying by the one or more counters a difference between the first time duration and the reference time duration.

According to one embodiment, the method further comprises receiving by each pixel a timing signal indicating the start time of the reference time duration.

According to one embodiment, the start time of the first time duration is triggered by a first edge of said oscillating output signal after the timing signal is asserted.

According to one embodiment, the one or more counters are adapted to quantify a first difference between the start of the first time duration and the start of the reference time duration and a second difference between the end of the first time duration and the end of the reference time duration.

According to yet a further aspect, there is provided a method of reading an array of pixels comprising at least one column of pixels and a plurality of rows, each pixel comprising a sensor and generating an oscillating output signal, the method comprising detecting the frequency of the oscillating output signal of each pixel by: generating in each pixel a first signal indicating the start and end times of a first time duration corresponding to a plurality of periods of the oscillating output signal of the pixel, wherein each row of pixels receives a timing signal indicating the start time of a reference time duration for the pixels of the row, the start time of the first time duration being triggered by the first edge of said oscillating signal after the timing signal is asserted; receiving by counters, at least one reference signal indicating the start and end times of the reference time duration; and quantifying by the counters a difference between the first time duration and the reference time duration by quantifying a first difference between the start of the first time duration and the start of the reference time duration and a second difference between the end of the first time duration and the end of the reference time duration, comprising quantifying, successively for each pixel of the column by a common counter of each column coupled to all of the pixels of the column, the second difference for the selected pixel, each row of pixels being selected during a different selection period, wherein the timing signal indicating the start time of the reference time duration for the pixels of a row is different for each row and defined such that the end of the first time duration of each pixel of a row appears during the selection period of the row to enable the quantification of the second difference by each common counter.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION

It will be apparent to those skilled in the art that the circuits and methods described herein could be applied to any type of sensor generating an output signal having an oscillation frequency which is a function of one or more environmental conditions, such as the level of infrared radiation. In some embodiments, the sensor is an oscillator. However, in alternative embodiments, a sensor of each pixel may generate a current or voltage level as a function of the environmental condition, and a further circuit of each pixel may generate the oscillating output signal at a frequency based on the current or voltage level.

Furthermore, while embodiments have been described in which the pixels of the detection device have dimensions such that they fall in the category of MEMS, it will be apparent to those skilled in the art that the methods and circuits described herein could be applied to pixels of different sizes, such as NEMS (Nano-Electro-Mechanical Systems).

Figure 1:
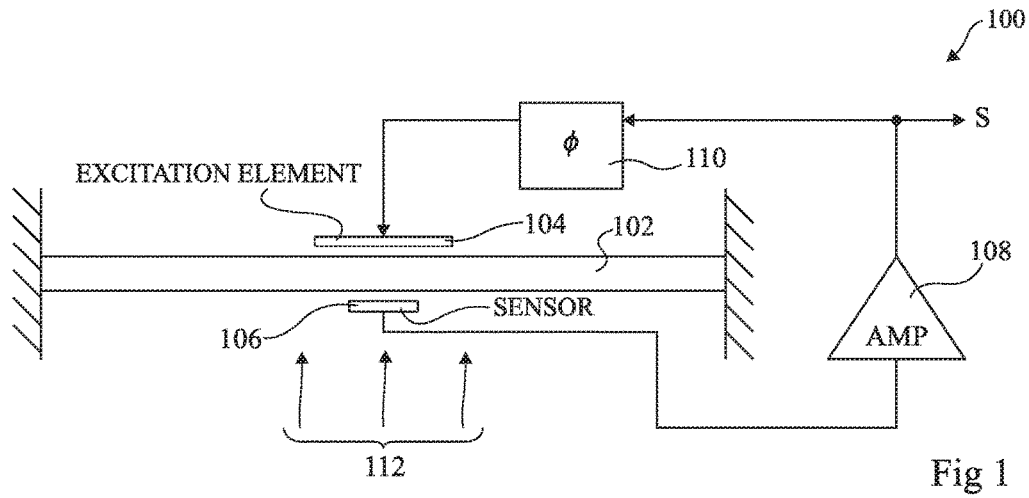
FIG. 1 schematically illustrates a MEMS oscillator according to an embodiment of the present disclosure.

FIG. 1 schematically illustrates an example of a MEMS oscillator 100.

The MEMS oscillator 100 comprises a beam 102, having one or both of its ends fixed to a support. The beam 102 has a certain degree of elasticity, and an excitation element 104 is for example adapted to electrostatically excite the beam 102 such that it resonates. A sensor 106 detects the displacement of the beam 102. The signal detected by the sensor 106 is for example amplified by an amplifier (AMP) 108 to generate a signal S. This signal S is also for example subjected to a phase shift by a phase shifter 110 before being supplied as the input signal to the excitation element 104.

As represented by arrows 112 in FIG. 1, the beam 102 receives radiation, such as infrared radiation, from a scene, which for example causes a modification in the oscillation frequency of the resonating beam 102. Thus by detecting the oscillation frequency of signal S, the level of the radiation in the scene can be detected.

Figure 2:
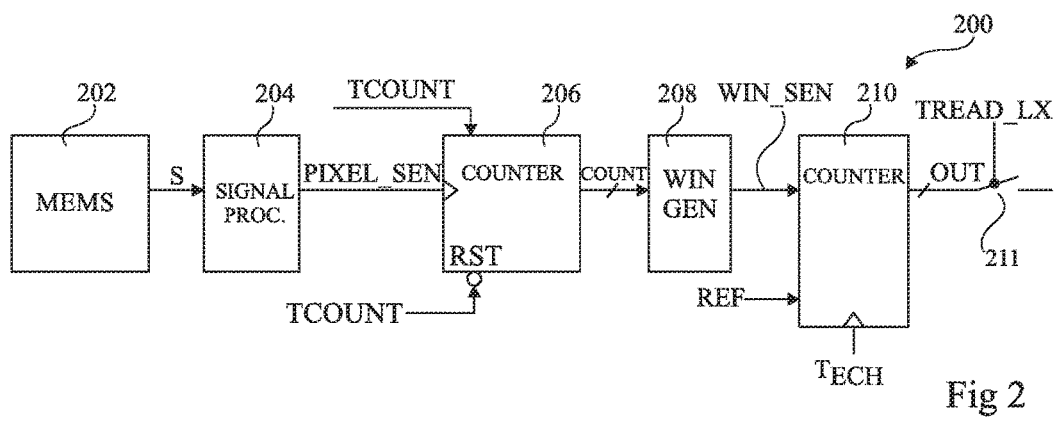
FIG. 2 schematically illustrates a detection device comprising a MEMS oscillator according to an embodiment of the present disclosure.

FIG. 2 illustrates a detection device 200 comprising a MEMS oscillator (MEMS) 202, which is for example the oscillator 100 of FIG. 1, and for example forms a pixel of an array of MEMS oscillators (not illustrated in FIG. 2). The pixel for example has a length and/or width of between 5 and 50 μm, although other dimensions would be possible.

The detection device 200 also comprises a frequency detection circuit for detecting the frequency of the oscillating signal S of the MEMS oscillator 202. The frequency detection circuit for example comprises a signal processing block 204, a counter (COUNTER) 206, a window generation circuit (WIN GEN) 208 and a counter circuit (COUNTER) 210.

The signal processing block 204 for example comprises a shaping circuit for converting the oscillating output signal S of the MEMS oscillator 202 into a signal PIXEL_SEN in the form of a square wave.

The counter 206 receives the signal PIXEL_SEN and a timing signal TCOUNT. The signal TCOUNT controls when the counter is triggered to start counting edges of the signal PIXEL_SEN. In particular, when the signal TCOUNT is asserted, the counter 206 outputs a value COUNT. The counter is able to count at least N significant edges, for example rising edges, of the signal PIXEL_SEN. The number N is for example an integer of 2 or more, and in some embodiments N is equal to at least 50. In one embodiment, N is equal to the count limit of the counter 206. In this embodiment, the timing signal TCOUNT is connected to a reset input (RST) of the counter 206. When the timing signal TCOUNT is low, the output of the counter is maintained at a reset value, corresponding to a low level "0", and when TCOUNT is high, the output of the counter provides a value COUNT which is incremented on each new significant edge of the signal PIXEL_SEN.

The window generation circuit 208 receives the count value from the counter 206 and generates a signal WIN_SEN indicating a time window $T_{WINDOW}$ corresponding to the duration of the N−1 periods of the signal PIXEL_SEN. In particular, the duration $T_{WINDOW}$ is equal to $(N-1)T_{SEN}$, where $T_{SEN}$ is the average period of the oscillating signal PIXEL_SEN over the N−1 periods.

The counter circuit 210 receives the signal WIN_SEN from the circuit 208, and comprises one or more counters clocked by a clock signal $T_{ECH}$. The frequency $F_{ECH}$ of the signal $T_{ECH}$, the number (N−1) of periods counted and the frequency of the oscillating signal PIXEL_SEN define the precision Δf around a mean frequency f of pixel frequencies with which the frequency of the oscillating signal can be detected. To respect the Shannon theorem, the frequency $F_{ECH}$ for example satisfies the following relation:

$$F_{ECH} > \frac{2*f^2}{(N-1)*\Delta f}$$

In some embodiments, the frequency of the clock signal $T_{ECH}$ is at least ten times the average oscillation frequency of pixels of the array at an ambient temperature, and is for example in the range 10 MHz to 10 GHz.

The counter circuit 210 also for example receives one or more reference signals REF indicating the start time and end time of a reference time duration $T_{REF}$. As will be described in more detail below, the reference time duration $T_{REF}$ may correspond to a fixed time period or may be modified by a reference pixel.

The counter circuit 210 provides an output count value OUT as a function of the duration $T_{WINDOW}$ of the N−1 periods of the oscillating signal PIXEL_SEN. However, rather than counting throughout the duration $T_{WINDOW}$, the counter circuit 210 for example determines a difference in duration between $T_{WINDOW}$ and the reference time duration $T_{REF}$.

In some embodiments, such as in the device of FIG. 4 discussed below, the counter 210 is entirely implemented in each pixel of the array. In alternative embodiments, such as in the device of FIG. 6 discussed below, the counter circuit 210 is partially implemented outside of the pixels, for example at the foot of each column of the pixel array.

Figure 3A:
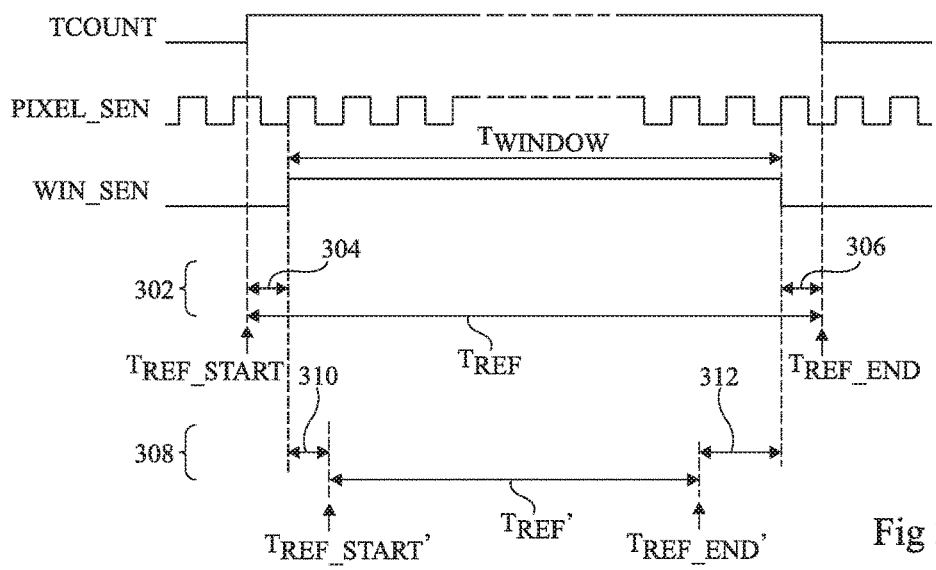
FIG. 3A is a timing diagram showing examples of signals in the detection device of FIG. 2.

FIG. 3A is a timing diagram showing examples of the signals TCOUNT, PIXEL_SEN and WIN_SEN in the circuit of FIG. 2, as well as examples of the time differences detected by the counter circuit 210 in order to evaluate the difference between the durations $T_{WINDOW}$ and $T_{REF}$.

The signal TCOUNT is for example initially low, and transitions to a logic high to trigger the counter 206 to start counting N significant edges of the signal PIXEL_SEN. An example of the square wave signal PIXEL_SEN is illustrated, and time duration $T_{WINDOW}$ of the N−1 periods of PIXEL_SEN for example starts from the first rising edge of PIXEL_SEN following the rising edge of TCOUNT, shortly after which the signal WIN_SEN goes high. The signal WIN_SEN goes low at the end of the time duration $T_{WINDOW}$ shortly after the Nth rising edge of the signal PIXEL_SEN.

The counter circuit 210 for example quantifies two time differences: a time difference between the start times of $T_{WINDOW}$ and $T_{REF}$; and a time difference between the end times of $T_{WINDOW}$ and $T_{REF}$. The difference in durations between $T_{WINDOW}$ and $T_{REF}$ are assumed in the following examples to be negative if $T_{WINDOW}$ is longer than $T_{REF}$, and positive if $T_{WINDOW}$ is shorter than $T_{REF}$, but the opposite could be true. In other words, the first difference (between start times) will be counted positively if $T_{REF}$ starts before $T_{WINDOW}$ and counted negatively if $T_{WINDOW}$ starts before $T_{REF}$. Similarly, the second difference (between end times) will be counted positively if $T_{REF}$ ends after $T_{WINDOW}$ and counted negatively if $T_{WINDOW}$ ends after $T_{REF}$. In the case, not represented, where the first and second differences are counted differently, meaning one positively and the other one negatively, the counter 210 is for example able to increment and decrement the value COUNT to get a correct global time difference between $T_{WINDOW}$ and $T_{REF}$.

In an example 302 of FIG. 3A of the count periods of the count circuit 210, a start time $T_{REF\_START}$ of $T_{REF}$ occurs before the start of $T_{WINDOW}$, and during the intervening period 304 the counter circuit 210 for example generates a first positive count value. An end time $T_{REF\_END}$ of $T_{REF}$ occurs after the end of $T_{WINDOW}$, and during the intervening period 306 the counter circuit 210 for example generates a second positive count value by incrementing the first positive count value on each significant edge of the clock signal $T_{ECH}$. The counter circuit 210 for example outputs the second count value as the output value OUT of the pixel.

In another example 308 of FIG. 3A of the count periods of the count circuit 210, the start time $T_{REF\_START}$ of $T_{REF}$ occurs after the start of $T_{WINDOW}$, and during the intervening period 310 the counter circuit 210 for example generates a first negative count value. The end time $T_{REF\_END}$ of $T_{REF}$ occurs before the end of $T_{WINDOW}$, and thus during the intervening period 312 the counter 210 for example generates a second negative count value by decrementing the first negative count value on each significant edge of the clock signal $T_{ECH}$. The counter circuit 210 for example outputs the second count value as the output value OUT of the pixel. It will be noticed that in the example 308, as both the first and second count values are negative, it is possible to use a classical counter, which increments COUNT from 0. More generally, when the sign of first and second count values are always the same it is not necessary to memorise the sign of COUNT.

Figure 3B:
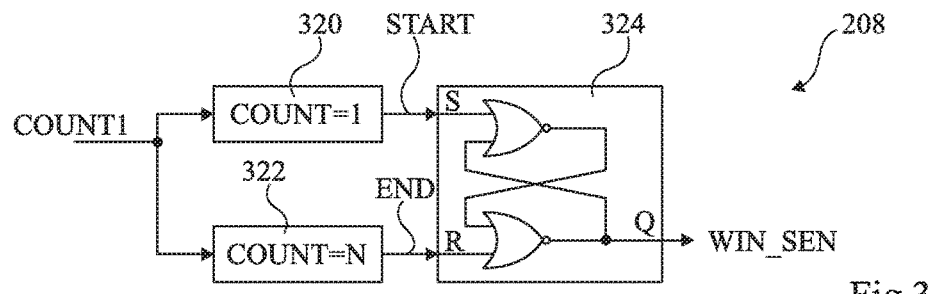
FIG. 3B schematically illustrates a window generator of the detection device of FIG. 2 in more detail according to an example embodiment.

FIG. 3B schematically illustrates the window generation circuit 208 of FIG. 2 in more detail according to one embodiment. The circuit 208 comprises logic block 320 and 322, which receive the count signal COUNT from the counter 206. The logic block 320 asserts a signal START at its output when the count value is at 1, in other words when the start of the count has been triggered. The logic block 322 asserts a signal END at its output when the count value is at N, in other words the N significant edges of the signal PIXEL_SEN or PIXEL_REF have elapsed. The signals START and END are provided as set (S) and reset (R) inputs respectively to an SR latch 424 having an output Q that will be asserted high when the signal START is asserted, and then brought low again when the signal END is asserted.

Figure 4:
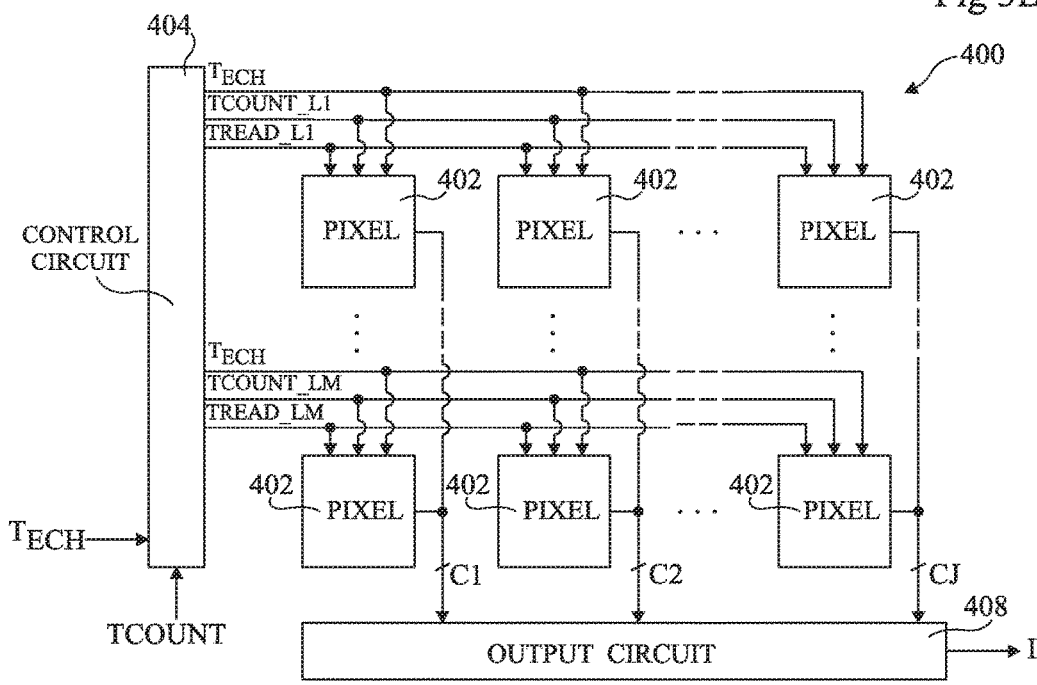
FIG. 4 schematically illustrates a detection device comprising an array of pixels each comprising a MEMS oscillator according to an embodiment of the present disclosure.

FIG. 4 schematically illustrates a detection device 400 according to an example in which it comprises an array of pixels 402 arranged in J columns and M rows, where J and M could be any positive integer. In the example of FIG. 4, the array has a rolling shutter operation in which the array is read row by row. The pixels 402 in the rows 1 to M therefore respectively receive signals TCOUNT_L1 to TCOUNT_LM, which are offset in time with respect to each other. However, it will be apparent to those skilled in the art that in alternative embodiments, the array could have a global shutter operation in which all of the pixels 402 receive the same signal TCOUNT. Each of the pixels also for example receives the clock signal $T_{ECH}$. Furthermore, the pixels 402 in the rows 1 to M respectively receive read phase timing signals TREAD_L1 to TREAD_LM generated by the control circuit 404. These signals for example ensure row selection thanks for example to a transistor acting as a switch 211 of FIG. 2 at the output of each pixel.

Each pixel 402 is for example identical to the pixel 200 of FIG. 2, except the signal TCOUNT of FIG. 2 is replaced in the pixels 402 by a corresponding one of the signals TCOUNT_L1 to TCOUNT_LM, and the signal REF in FIG. 2 is provided by the corresponding signal TCOUNT_L1 to TCOUNT_LM.

The control block 404 for example generates the signals TCOUNT_L1 to TCOUNT_LM based on a global timing signal TCOUNT.

Each pixel 402 comprises the counter circuit 210 of FIG. 2, and the output of this counter provides the output of each pixel. As illustrated in FIG. 4, the output lines of each column 1 to J are coupled, via a respective column lines C1 to CJ, to an output circuit 408 at the foot of the columns, which provides an output image I of the pixel array.

Figure 5:
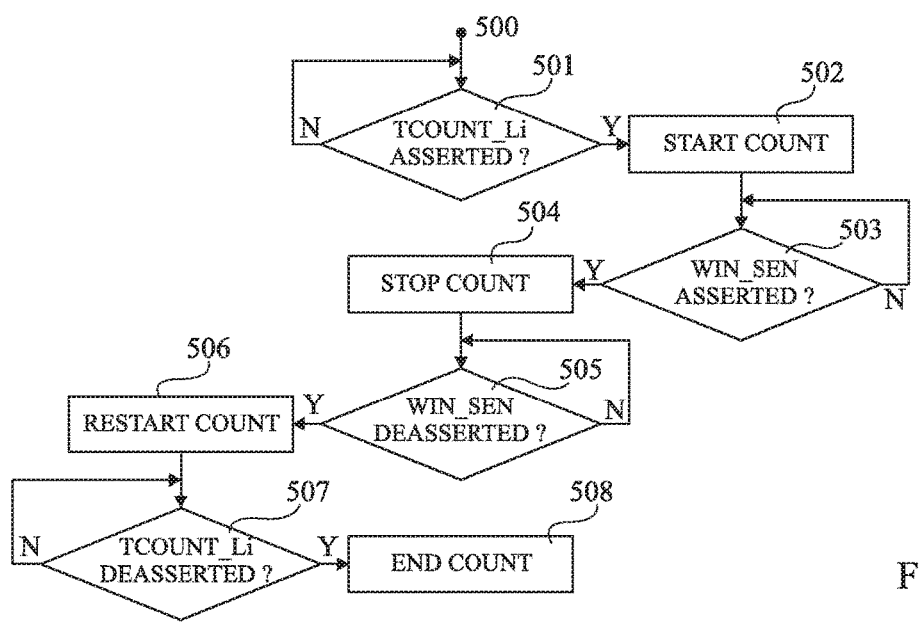
FIG. 5 is a flow diagram showing steps in a method of detecting the frequency of an oscillating signal according to an embodiment of the present disclosure.

FIG. 5 is a flow diagram illustrating one example of method steps for detecting the frequency of an oscillating signal in the detection device of FIG. 4. This method is for example implemented by the circuit of each pixel 402. Besides, in this example we consider that we are in the case 302 described above and illustrated in FIG. 3A.

From a start point 500, an operation 501 for example involves determining whether the signal TCOUNT_Li has been asserted, where i is the corresponding row 1 to M. If so, the next operation is 502. If not, the operation 501 is repeated until this condition becomes true.

In operation 502, a positive count is started, for example using the counter circuit 210 of FIG. 2.

In a subsequent operation 503, it is determined whether the signal WIN_SEN is asserted. If so, the next operation is 504. If not, the operation 503 is repeated until this condition becomes true.

In operation 504, the count started in operation 502 is stopped, which for example results from the input signal WIN_SEN of counter 210 of FIG. 2 going high.

In a subsequent operation 505, it is determined whether the signal WIN_SEN is deasserted. If so, the next operation is 506. If not, the operation 505 is repeated until this condition becomes true.

In operation 506, the count is restarted, for example by the counter circuit 210 of FIG. 2 continuing to count from the value it reached between operations 502 and 504.

In a subsequent operation 507, it is determined whether the signal TCOUNT_Li is deasserted. If so, the next operation is 508. If not, the operation 507 is repeated until this condition becomes true.

In operation 508, the count is ended. In particular, the counter circuit 210 of FIG. 2 is for example stopped by the signal TCOUNT_Li going low. The count value that has been reached provides the output signal OUT of the pixel.

Figure 6:
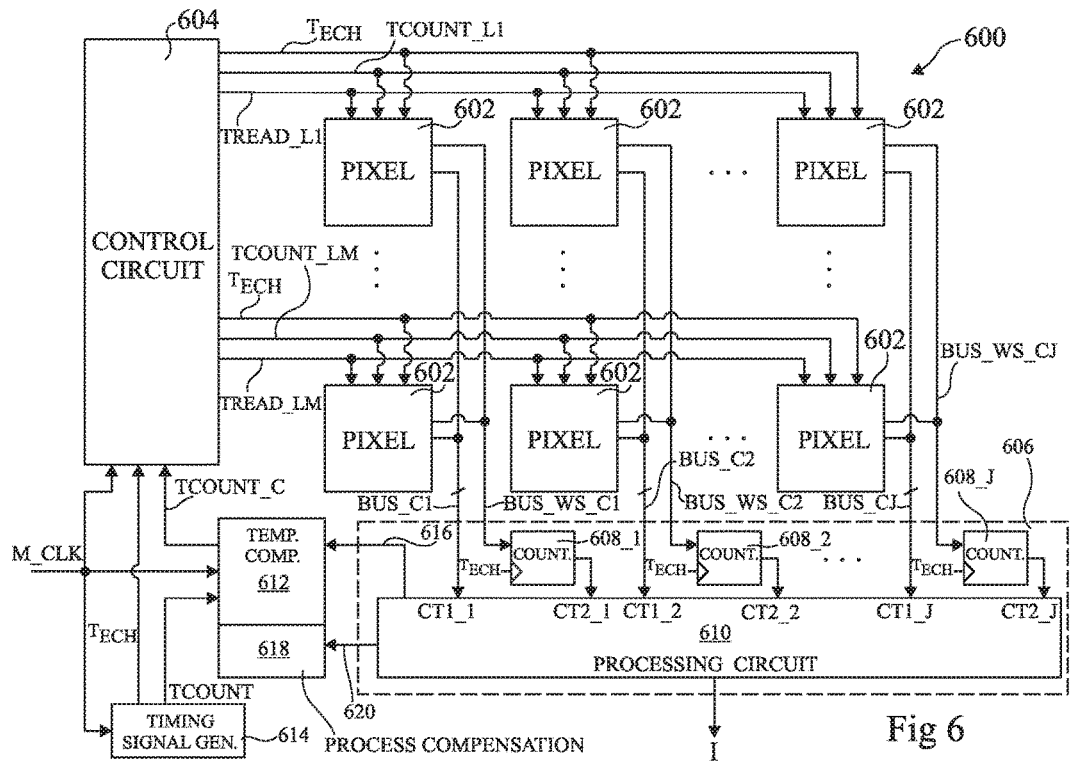
FIG. 6 schematically illustrates a detection device comprising an array of pixels each comprising a MEMS oscillator according to a further embodiment of the present disclosure.

FIG. 6 illustrates a detection device 600 according to an alternative embodiment to that of FIG. 4. The device 600 of FIG. 6 comprises an array of pixels 602, each pixel having a circuit similar to that of FIG. 2 described above, except that at least part of the counter circuit 210 of each pixel is implemented at the foot of each column.

The pixels 602 in FIG. 6 are for example arranged in J columns and M rows, where J and M could be any positive integer. Each of the pixels 602 for example receives the timing signal $T_{ECH}$. In the example of FIG. 6, the array operates a rolling shutter operation, the pixels 602 in the rows 1 to M respectively receiving signals TCOUNT_L1 to TCOUNT_LM generated by a control circuit 604. Furthermore, the pixels 602 in the rows 1 to M respectively receive read phase timing signals TREAD_L1 to TREAD_LM also generated by the control circuit 604, allowing the row selection of line 1 to M.

The control circuit 604 for example generates the signals TCOUNT_L1 to TCOUNT_LM based on master clock signal M_CLK and a timing signal TCOUNT_C. The control circuit 604 also for example receives the signal $T_{ECH}$.

In the embodiment of FIG. 6, the timing signals TCOUNT_L1 to TCOUNT_LM indicate the start of the reference duration $T_{REF}$ for each pixel 602, and each pixel comprises a counter for quantifying the time difference between the start of the reference duration $T_{REF}$ and the start of the corresponding duration $T_{WINDOW}$.

The difference between the end of the reference duration $T_{REF}$ and the end of the duration $T_{WINDOW}$ is quantified for each pixel by an output circuit 606 at the foot of the columns. For example, as illustrated in FIG. 6, the pixels 602 of each column 1 to J output a count value CT1_1 to CT1_J on corresponding column line buses BUS_C1 to BUS_CJ respectively. Furthermore, the pixels 602 of each column 1 to J output signals based on the signal WIN_SEN of each pixel on corresponding column line buses BUS_WS_C1 to BUS_WS_CJ.

The output circuit 606 for example comprises counters 608_1 to 608_J associated respectively with the columns 1 to J and clocked by the signal $T_{ECH}$. As will be explained in more detail below, each of the counters 608_1 to 608_J for example quantifies the difference between the falling edge of the corresponding signal WIN_SEN with respect to the end of a read phase associated with the row being read. The resulting count values CT2_1 to CT2_J from the counters 608_1 to 608_J are provided to a processing circuit 610, which for example outputs an image I based on the captured values.

The signal TCOUNT_C provided to the control circuit 604 is for example generated by a temperature compensation circuit 612 based on a timing signal TCOUNT provided by a timing signal generation circuit 614. Two different possible embodiments of the temperature compensation circuit 612 are described later respectively in relation with FIGS. 8A/8B and FIGS. 10A/10B. The timing signal generation circuit 614 for example generates the signals TCOUNT and $T_{ECH}$ based on the master clock signal M_CLK.

A process compensation circuit 618 linked to the output circuit 606 and the array of pixels 602 may also be used. A possible embodiment of such a process compensation circuit 618 is described in more detailed later in relation with FIG. 9B.

Figure 7:
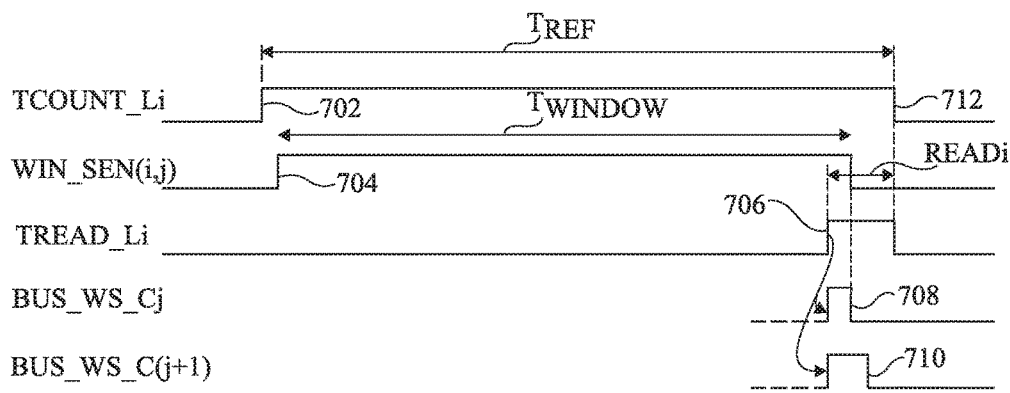
FIG. 7 is a timing diagram showing examples of signals in the detection device of FIG. 7.

FIG. 7 is a timing diagram illustrating examples of the signal TCOUNT_Li, the signal WIN_SEN(i,j), the signal TREAD_Li and the signal BUS_WS_Cj, for a pixel in row i and column j of the array of FIG. 6, and the signal BUS_WS_C(j+1) for a pixel in row i and column j+1 of the array.

As illustrated, the signal TCOUNT_Li for example has a rising edge 702 triggering, a short time later, a rising edge 704 of the signal WIN_SEN(i,j). The signal TREAD_Li for example goes high during a read period associated with the row i of the array. The signal BUS_WS_Cj for example has a rising edge triggered by a rising edge 706 of the signal TREAD_Li, and a falling edge 708 triggered by the falling edge of the signal WIN_SEN(i,j). The duration of the high pulse of the signal BUS_WS_Cj is thus a function of the duration of $T_{WINDOW}$ for the pixel i,j.

The signal BUS_WS_C(j+1) for example has a rising edge triggered by the rising edge 706 of the signal TREAD_Li, and a falling edge 710 triggered by a falling edge of the signal WIN_SEN(i,j+1) (not illustrated in FIG. 7). The duration of the high pulse of the signal BUS_WS_C(j+1) is thus a function of the duration of $T_{WINDOW}$ for the pixel i,j+1.

The signal WIN_SEN for each pixel of the row i has a falling edge that falls within the read period READi associated with the row i of the array, such that the timing of the falling edge can be captured by a corresponding one of the counters 608_1 to 608_J at the bottom of the columns.

The reference time duration $T_{REF}$ may be defined in different ways. In the above example, we have considered that the reference time duration $T_{REF}$ corresponds to the time during which the signal TCOUNT_Li is high, from rising edge 702 to a falling edge 712, the latter corresponding to the end of the read period READi. In that case, the counters 608_1 to 608_J at the bottom of the columns will count positively, from the falling edge of the signal WIN_SEN(I,j) and the falling edge of signal TCOUNT_Li. For a selected row, the count values CT2-1 to CT2_J provided by each counter 608_1 to 608_J are for example respectively added to the count values CT1_1 to CT1_J provided by the pixels, to obtain total count values CT_1 to CT_J for the selected row. All the total count values obtained for all rows will constitute an image I.

In some cases, the potential time range within which the end of the duration $T_{WINDOW}$ falls may be longer than the desired read time slot. In such a case, the output circuit 606 may comprise more than one counter per column, such that the read time slot for each row of the pixel array can be extended. Additionally or alternatively, one or more of the techniques that will now be described with reference to FIGS. 8A, 8B, 9A, 9B, 9C, 10A and 10B may be employed.

While in the embodiment of FIGS. 6 and 7 each pixel comprises a counter for quantifying the time difference between the start of the reference duration $T_{REF}$ and the start of the corresponding duration $T_{WINDOW}$, in alternative embodiments, this quantification could be performed at the bottom of the columns in a similar manner to what is described above with respect to the quantification of the difference between the end of the reference duration $T_{REF}$ and the end of the duration $T_{WINDOW}$. For example, a further common counter could be provided at the foot of each column, and could be coupled to each pixel of the column by further column lines and appropriate selection means. The selection between the column lines is then for example performed based on the signal TCOUNT_Li of each line.

Figure 8A:
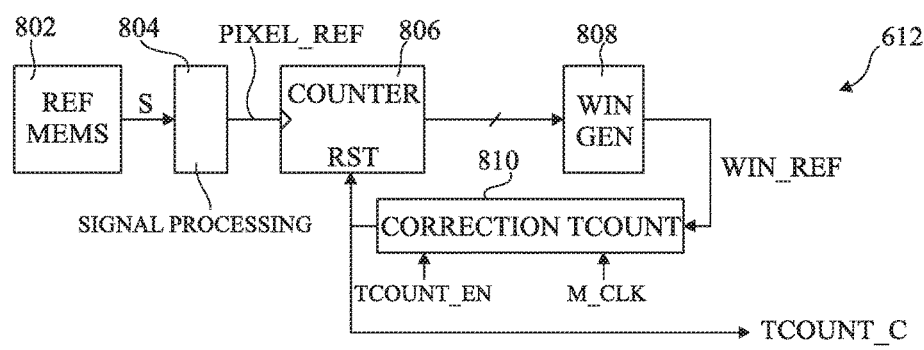
FIG. 8A schematically illustrates a substrate temperature compensation circuit of FIG. 6 in more detail according to an example embodiment.

FIG. 8A illustrates an example of the temperature compensation circuit 612 of FIG. 6 for generating the signal TCOUNT_C. In some embodiments, there is a single circuit 612 for the whole array. Alternatively, to compensate for more local temperature variations, there could be more than one circuit 612, each being positioned and associated with a block of pixels of the array.

The circuit 612 for example comprises a reference MEMS oscillator (REF MEMS) 802 blinded from the image scene. The reference MEMS oscillator 802 generates an output signal S, which is for example provided to a signal processing block 804 for example comprising a shaping circuit for converting the oscillating output signal S of the oscillator 202 into a signal PIXEL_REF in the form of a square wave. The signal PIXEL_REF, is in turn provided as a clock input to a counter (COUNTER) 806, which also receives the signal TCOUNT_C. A window generation circuit (WIN GEN) 808, which can for example be similar to block 208, generates a signal WIN_REF based on the count value provided by the counter 806. A TCOUNT correction circuit (CORRECTION TCOUNT) 810 for example receives the master clock signal M_CLK and the signal TCOUNT. The circuit 810 for example adjusts the timing of the rising edge of the signal TCOUNT_C by quantifying the duration of the signal WIN_REF as will now be described in more detail with reference to FIG. 8B.

Figure 8B:
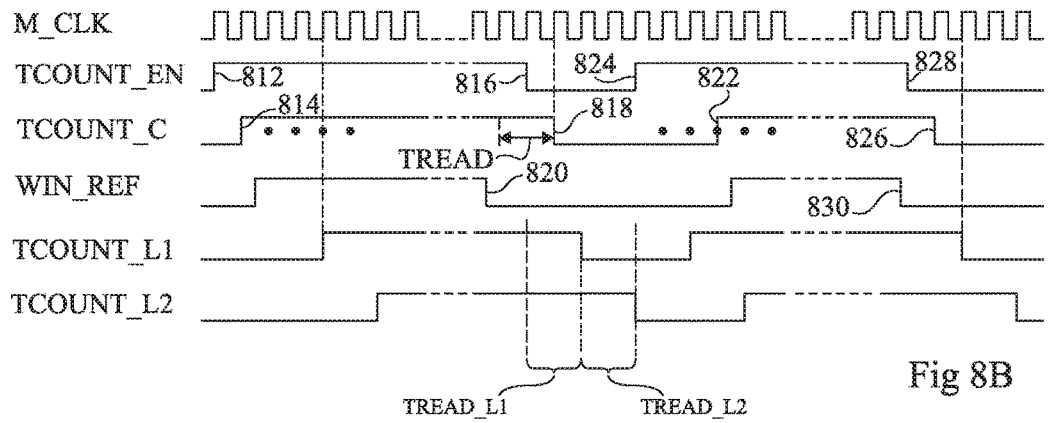
FIG. 8B is a timing diagram showing examples of signals in the circuit of FIG. 8A.

FIG. 8B is a timing diagram illustrating examples of the signals M_CLK, TCOUNT, TCOUNT_C, WIN_REF, TCOUNT_L1 and TCOUNT_L2 in the circuits of FIGS. 6 and 8A.

The signal TCOUNT for example has pulses of constant duration, the pulses being repeated with a same frequency based on the master clock signal M_CLK. The signal TCOUNT_C may initially have pulses of the same duration as the pulses of the signal TCOUNT. However, as explained below, their duration may be reduced by delaying more or less the rising edge of TCOUNT_C compared to the rising edge of TCOUNT (the falling edges of both signals being always delayed the same way). For example, the duration of the pulses of the signal TCOUNT are chosen to be appropriate for longest durations of WIN_REF to ensure that the signal TCOUNT is still high at the end of the window of the WIN_REF signal (after N−1 periods of signal PIXEL_REF counted by counter 806). The end of the signal TCOUNT_C must be such that after use by the control circuit 604 the falling edge of each signal TCOUNT_Li corresponds to the end of the associated period READi. If we consider that signals TCOUNT_Li are generated by delaying TCOUNT_C, and given the fact that the READ periods are defined periodically according to the master clock M_CLK, then the falling edge of TCOUNT_C must always end similarly, periodically according to the master clock M_CLK. In this example, the signal TCOUNT has a rising edge 812, which in the example of FIG. 8B is triggered by a rising edge of the master clock M_CLK. A rising edge 814 of the signal TCOUNT_C is generated by delaying the rising edge 812 of the signal TCOUNT by one or more clock periods of the master clock M_CLK, depending on the measured length of WIN_REF. Initially, the delay is for example equal to substantially the minimum delay that may be applied, so that the end of WIN_REF happens before the end of TCOUNT whatever the condition. For example, dots in FIG. 8B represent possible times for the rising edge 814, and in one embodiment the edge 814 may be delayed by between one and five periods of the clock signal M_CLK, and initially it is asserted with a delay of one clock period.

The rising edge 814 of the signal TCOUNT_C causes the counter 806 to start counting oscillations of the signal PIXEL_REF (not illustrated in FIG. 8B), and thus the signal WIN_REF goes high when a first rising edge of the signal PIXEL_REF is detected.

A falling edge 816 of the signal TCOUNT for example triggers, one period of the clock signal M_CLK later, a falling edge 818 of the signal TCOUNT_C. The signal WIN_REF has a falling edge 820 occurring at a time dependent on the temperature condition of the reference oscillator 802. The timing of the signal TCOUNT_C is for example modified for a subsequent cycle based on the timing of the falling edge 820 of the signal WIN_REF with respect to a falling edge 818 of the signal TCOUNT_C. For example, the falling edge 820 of the signal WIN_REF is compared to the falling edge 818 of the signal TCOUNT_C, and if it occurs outside a time window TREAD defined before this falling edge, the delay of the next rising edge of the signal TCOUNT_C is adjusted. For example, in the example of FIG. 8B, falling edge 820 of the signal WIN_REF occurs earlier than the time window TREAD preceding falling edge 818 of the signal TCOUNT_C, two periods of the master clock M_CLK before, and thus the subsequent rising edge 822 of the signal TCOUNT_C is delayed in this example by two periods of the master clock M_CLK with respect to the rising edge 824 of the signal TCOUNT. The falling edge 826 of the signal TCOUNT_C still however has a one period delay with respect to the falling edge 828 of the signal TCOUNT. Thus the falling edge 830 of the signal WIN_REF is brought closer to the falling edge 826 of the signal TCOUNT_C, inside a time window TREAD before this falling edge 826. The signal TCOUNT_C is then correctly adjusted.

The signal TCOUNT_L1 provided to the pixels of the first row of the array for example corresponds to the signal TCOUNT_C delayed by one clock period of the signal M_CLK. The read period of the first row, labelled TREAD_L1 in FIG. 8B, for example corresponds to the two clock periods prior to the falling edge of the signal TCOUNT_L1. The signal TCOUNT_L2 provided to the pixels of the second row of the array corresponds to the signal TCOUNT_L1 delayed by one TREAD period (which for example corresponds to the signal TCOUNT_C delayed by three clock periods of the signal M_CLK). The read period of the second row, labelled TREAD_L2 in FIG. 8B, for example corresponds to the two clock periods prior to the falling edge of the signal TCOUNT_L2.

Dispersion between pixels in the array may cause a variation in the oscillation frequency between the MEMS in the array by up to 5% in some cases, which can be one cause for falling edges of the signal WIN_SEN falling outside the corresponding read time slot of the row TREAD_Li. Such a dispersion can be at least partially corrected by adjusting the timing signal TCOUNT_C within each pixel, as will now be described with reference to FIGS. 9A and 9B.

Figure 9A:
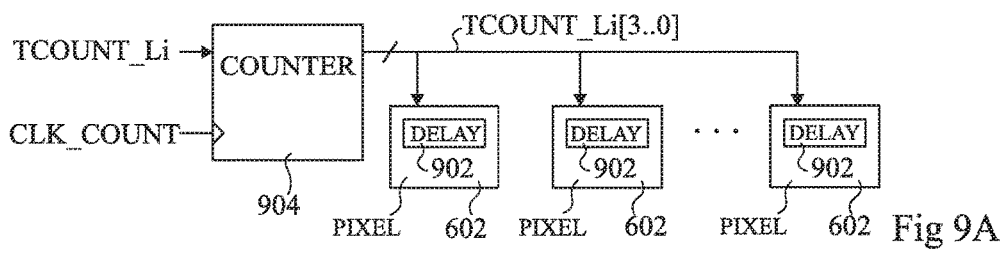
FIG. 9A schematically illustrates a row of pixels of the array of FIG. 4 or 6 according to an embodiment of the present disclosure.

FIG. 9A schematically illustrates an i-th row of pixels 602 of the pixel array of FIG. 6, i being comprised between 1 and M. Rather than the timing signal TCOUNT_Li, each pixel 602 in the row receives a timing signal TCOUNT_Li[3 . . . 0] (with more or less bits depending on the dispersion) provided by a counter 904, for example generated based on the signal TCOUNT_Li and a clock signal CLK_COUNT, which is synchronised with the master clock signal M_CLK. The clock signal CLK_COUNT is for example identical to the master clock or at a lower frequency, depending on the precision needed for the shortest delay increment, as will be understood after reading the following description. Each pixel 602 also comprises a delay circuit 902 for generating a timing signal having a desired time offset with respect to the signal TCOUNT_L1.

Figure 9B:
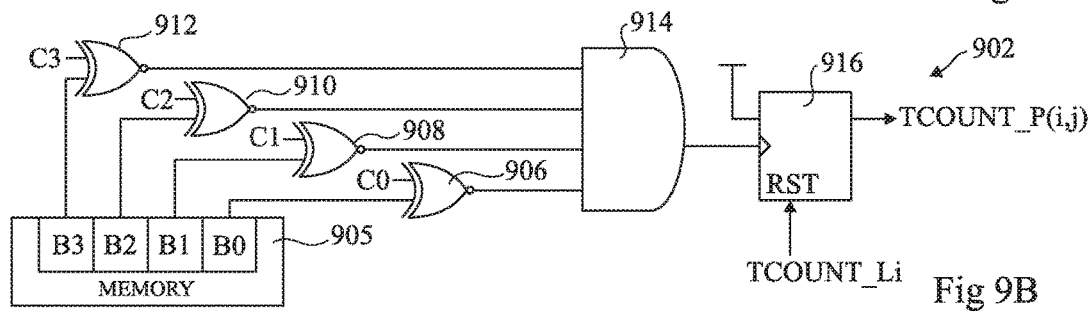
FIG. 9B illustrates a delay circuit of FIG. 9A in more detail according to an embodiment of the present disclosure.

FIG. 9B illustrates the delay circuit 902 of a pixel Pj of an i-th pixel row in more detail, j being comprised between 1 and J. The delay circuit 902 for example comprises a memory 905 storing a digital delay value. In the example of FIGS. 9A and 9B, the count signal TCOUNT_Li[3 . . . 0] is a 4-bit count value having bits C3 to C0, and the delay value is a 4-bit value having bits B3 to B0. However, in alternative embodiments, the count value and the delay value could each have a different number of bits, for example two or more bits.

The delay circuit 902 also comprises four 2-input XNOR gates 906, 908, 910 and 912, each have one input coupled to the memory 905 for receiving a corresponding one of the bits B0 to B3 respectively, and its other input coupled to one of the output lines of the counter 904 for receiving a corresponding bit C0 to C3 of the count signal TCOUNT_L1[3 . . . 0], which for example has the same number of bits as the delay value.

The outputs of the XNOR gates 906 to 912 are coupled to a 4-input AND gate 914, which in turn has its output coupled to a flip-flop 916. The flip-flop 916 asserts a timing signal TCOUNT_P(i,j) of the pixel when the count value C3 to C0 matches the delay value B3 to B0. The timing signal TCOUNT_P(i,j) replaces the signal TCOUNT in FIG. 2 for controlling the counter 206 to start counting the N significant edges of the signal PIXEL_SEN(i,j) of the j-th pixel of the i-th row.

Operation of the circuits of FIGS. 9A and 9B will now be described in more detail with reference to the timing diagram in FIG. 9C.

Figure 9C:
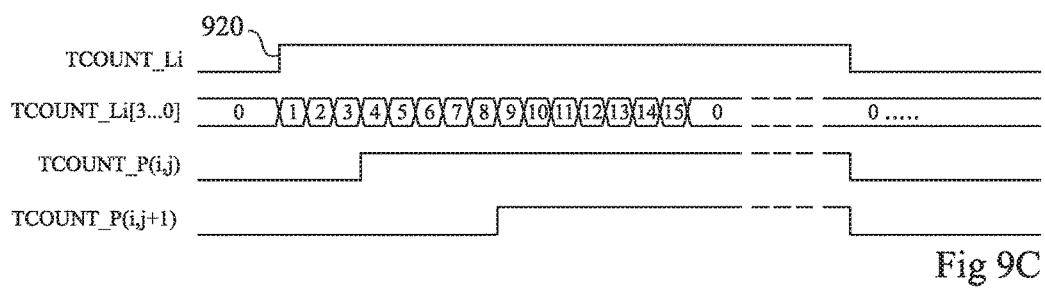
FIG. 9C is a timing diagram showing signals in the circuits of FIGS. 9A and 9B according to an example embodiment.

FIG. 9C shows examples of the signals TCOUNT_Li, and TCOUNT_Li[3 . . . 0], as well as the signal TCOUNT_P(i,j) generated in a j-th pixel of the i-th row of the pixel array, and the TCOUNT_P(I,j+1) generated in a (j+1)-th pixel of the i-th row of the pixel array.

A rising edge 920 of the signal TCOUNT_Li for example causes the counter 904 to start counting, and the count increments from binary "0000" to binary "1111" on each rising edge of the clock signal CLK_COUNT, corresponding to 0 to 15 in decimal. The pixel P(i,j) for example has a delay value set at binary "0100", and thus when the count reaches decimal 4, the signal TCOUNT_P(I,j) goes high. The pixel P(i,j+1) for example has a delay value set at binary "1001", and thus when the count reaches decimal 9, the signal TCOUNT_P(I,j+1) goes high.

The delay value for each pixel is for example determined during an initiation phase of the detection device 600, during which a black-body source is for example placed in the image scene of the detection device 600, all pixels receiving the same environmental signal, for example the same infrared radiation. All memories 905 are for example initially set to 0000 and a first image of the array, with no delay applied to signal TCOUNT_Li, is taken. An average pixel value of the array is then for example associated with a delay value of binary "1000". A delay value for each pixel is then generated to be inversely proportional to the duration $T_{WINDOW}$ of each pixel. In other words, the pixels having the longest durations $T_{WINDOW}$ are assigned relatively low delay values, and the pixels having the shortest durations $T_{WINDOW}$ are assigned relatively high delay values (to ensure that every WIN_SEN(i,j) must fall in its time read slot TREAD_Li). The period of the clock signal CLK_COUNT is also for example chosen in order to provide the desired adjustment to the end times of the windows $T_{WINDOW}$ based on the variations in the duration $T_{WINDOW}$ among the pixels of the array.

The generated delay values are then loaded to and stored in the memories 905 of the corresponding pixels. The memories 905 are for example volatile memories, and the delay values are also for example stored in a non-volatile memory outside the pixel array, for example the memory 618 described above in relation with FIG. 6, such that they may be loaded to the memories 905 of each pixel each time the detection device is powered-up. It is also possible, during the circuit's life, to update the values stored in the memory 618 to take into account so-called process variations of the circuit due to the circuit's aging.

Another possible embodiment of the substrate temperature variation correction circuit 612 of FIG. 6 will now be described with reference to FIGS. 10A and 10B. This circuit can be used to adjust the timing signal TCOUNT_C to compensate for temperature variations in the temperature of the substrate based on an analysis of the pixel values read from the pixel array, these pixel values being provided to the circuit 612 by the processing circuit 610.

Figure 10A:
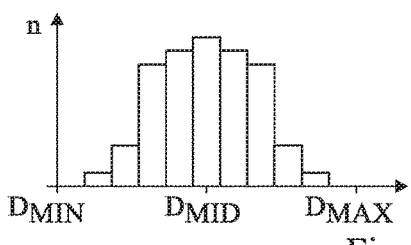
FIGS. 10A and 10B are histograms showing examples of the distribution of pixel values in the detection device of FIG. 6.
Figure 10B:
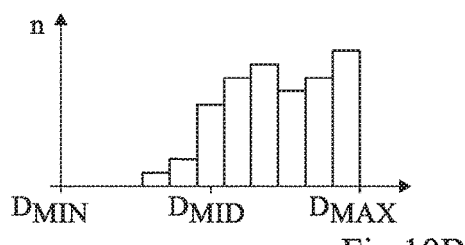

FIGS. 10A and 10B are histograms illustrating examples of the distribution of pixel values. The histogram of FIG. 10A corresponds to the case of an ambient temperature of the detection device 600, leading to a well-balanced distribution in which the number n of pixels having the various different pixel values have a distribution that is well centred around a middle pixel value $D_{MID}$. However, the histogram of FIG. 10B corresponds to the case that, with a change in temperature, the number n of pixels having the various different pixel values may be skewed such that a high proportion of pixels are saturated at the maximum pixel value $D_{MAX}$. The timing of the rising edge of the signal TCOUNT_C is thus for example progressively delayed until the pixel values are well balanced around the middle value $D_{MID}$. Of course, if the opposite were true and the pixel values were skewed such that a relatively high proportion of pixels were at the minimum pixel value $D_{MIN}$, the timing of the rising edge of the signal TCOUNT_C could be progressively brought forward until the pixel values are well balanced around the middle value $D_{MID}$.

The substrate temperature variation correction circuit 612 can implement such a regulation process dynamically, by analysing the following images I provided by the processing circuit 610. The correction update may be done taking into account all images or one every n images. The initialisation of this correction may start with a predefined delay between the signals TCOUNT and TCOUNT_C, such as for example a delay which corresponds to an expected adapted delay for a nominal temperature of for example 25° C., and a circuit presenting nominal process parameters. However, whatever the value of the delay chosen for the initialisation phase, the regulation process will ensure that the pixel values are well balanced around the middle value $D_{MID}$. While in the example of FIGS. 10A and 10B the range of pixel values is divided into 11 pixel value sub-ranges in order to construct the histogram, in alternative embodiments it would be possible to observe only two or more pixel value sub-ranges. For example, each pixel value could be classified as being higher or lower than the middle value $D_{MID}$, and the timing of TCOUNT_C could be adjusted such that the number of pixel values lower than $D_{MID}$ is equal to the number of pixel values higher than $D_{MID}$, for example with a tolerance of plus or minus 10 percent.

An advantage of the embodiments described herein is that the frequency of the output signals of an array of oscillators can be detected in a simple fashion, with a relatively compact circuit.

Having thus described at least one illustrative embodiment, various alterations, modifications and improvements will readily occur to those skilled in the art.

For example, it will be apparent to those skilled in the art that circuits described herein that are responsive to rising edges of input signals could in alternative embodiments be configured to be responsive to falling edges.

Furthermore, embodiments have been described in which counters are used to quantify the difference in duration between the time durations $T_{WINDOW}$ and $T_{REF}$ by counting periods of a timing signal during the relevant intervals. It will however be apparent to those skilled in the art that in alternative embodiments, different types of circuits could be used to quantify the durations of the relevant intervals, such circuits providing a result broadly equivalent to that of such a counter.

Furthermore, it will be apparent to those skilled in the art that the various features described with reference to the various embodiments could be combined, in alternative embodiments, in any combination.

The invention claimed is:

1. A detection device comprising:
 an array of pixels comprising at least one column of pixels and a plurality of rows, each pixel comprising a sensor and generating an oscillating signal; and
 a frequency detection circuit for detecting the frequency of the oscillating output signal of each pixel, comprising:
 in each pixel, a window generation circuit adapted to generate at least one output signal indicating the start and end times of a first time duration corresponding to a plurality of periods of the oscillating output signal of the pixel, wherein each row of pixels is adapted to receive a timing signal indicating the start time of a reference time duration for the pixels of the row, the start time of the first time duration being triggered by the first edge of said oscillating signal after the timing signal is asserted; and
 counters adapted to receive at least one reference signal indicating the start and end times of the reference time duration, and to quantify, for each pixel, a difference between the first time duration and the reference time duration, wherein:

the counters are adapted to quantify a first difference between the start of the first time duration and the start of the reference time duration and a second difference between the end of the first time duration and the end of the reference time duration;

the counters comprise, for each column, a common counter coupled to all of the pixels of the column through selection means and adapted to quantify, successively for each pixel of the column, the second difference for the selected pixel, each row of pixels being selected during a different selection period; and the timing signal indicating the start time of the reference time duration for the pixels of a row is different for each row and defined such that the end of the first time duration of each pixel of a row appears during the selection period of the row to enable the quantification of the second difference by each common counter.

2. The detection device of claim 1, wherein each of the start and end times of the first time duration and the reference time duration are indicated by a signal edge.

3. The detection device of claim 1, wherein the counters are adapted:
to quantify the first difference by incrementing or decrementing a count value based on the respective timing of the start of the first time duration and the start of the reference time duration; and
to quantify the second difference by incrementing or decrementing a count value based on the respective timing of the end of the first time duration and the end of the reference time duration.

4. The detection device claim 1, further comprising a control circuit adapted to generate the timing signal based on a reference pixel blinded from the image scene.

5. The detection device of claim 4, wherein each pixel further comprises a delay circuit adapted to shift the timing of the timing signal to adjust the start time of said reference time duration.

6. The detection device of claim 5, wherein the delay circuit comprises a memory storing one or more bits of data indicating the adjustment to be made to the start time of said reference time duration.

7. The detection device of claim 1, wherein:
each pixel comprises a first counter adapted to output a first count value representing a time interval between the start times of the reference time duration and the first time duration; and
each common counter is adapted to receive the output signal from each pixel of the column and to generate a second count value representing a time interval between the end times of the reference time duration and first time duration.

8. The detection device of claim 1, further comprising a processing circuit adapted to process the quantified differences between the first time duration and the reference time duration for a plurality of said pixels, and to adjust the start time of said timing signal for said plurality of pixels based on said quantified differences.

9. The detection device of claim 8, wherein the processing circuit is adapted to adjust the start time of said timing signal such that a certain proportion of said quantified differences fall with a certain range.

10. A method of reading an array of pixels comprising at least one column of pixels and a plurality of rows, each pixel comprising a sensor and generating an oscillating output signal, the method comprising detecting the frequency of the oscillating output signal of each pixel by:

generating in each pixel a first signal indicating the start and end times of a first time duration corresponding to a plurality of periods of the oscillating output signal of the pixel, wherein each row of pixels receives a timing signal indicating the start time of a reference time duration for the pixels of the row, the start time of the first time duration being triggered by the first edge of said oscillating signal after the timing signal is asserted;

receiving by counters, at least one reference signal indicating the start and end times of the reference time duration; and quantifying by the counters a difference between the first time duration and the reference time duration by quantifying a first difference between the start of the first time duration and the start of the reference time duration and a second difference between the end of the first time duration and the end of the reference time duration, comprising quantifying, successively for each pixel of the column by a common counter of each column coupled to all of the pixels of the column, the second difference for the selected pixel, each row of pixels being selected during a different selection period, wherein the timing signal indicating the start time of the reference time duration for the pixels of a row is different for each row and defined such that the end of the first time duration of each pixel of a row appears during the selection period of the row to enable the quantification of the second difference by each common counter.

11. The method of claim 10, further comprising receiving by each pixel a timing signal indicating the start time of the reference time duration.

12. The method of claim 11, wherein the start time of the first time duration is triggered by a first edge of said oscillating output signal after the timing signal is asserted.

* * * * *